United States Patent [19]

Ishikawa et al.

[11] Patent Number: 4,671,854
[45] Date of Patent: Jun. 9, 1987

[54] METHOD FOR PREPARING A PRINTED CIRCUIT BOARD WITH SOLDER PLATED CIRCUIT AND THROUGH-HOLES

[75] Inventors: Katsukiyo Ishikawa, Kyoto; Kanji Nishijima, Osaka; Mamoru Seio, Hyogo, all of Japan

[73] Assignee: Nippon Paint Co., Ltd., Osaka, Japan

[21] Appl. No.: 855,362

[22] Filed: Apr. 24, 1986

[30] Foreign Application Priority Data

Apr. 24, 1985 [JP] Japan .................. 60-87997

[51] Int. Cl.⁴ .......................... C23F 1/02; B44C 1/22; C03C 15/00; C03C 25/06
[52] U.S. Cl. .................. 156/659.1; 29/852; 156/656; 156/902; 156/904; 427/97; 430/318
[58] Field of Search .............. 156/656, 659.1, 666, 156/901, 902, 904; 427/96, 97, 98; 430/313, 318; 174/68.5; 29/846, 852

[56] References Cited

U.S. PATENT DOCUMENTS 4,325,780  4/1982  Schulz ..................... 156/659.1
4,487,654  12/1984  Coppin ..................... 156/645

*Primary Examiner*—William A. Powell
*Attorney, Agent, or Firm*—Wenderoth, Lind & Ponack

[57] ABSTRACT

The invention provides a method for preparing a printed circuit board with solder plated circuit and through-holes, using a specifically prepared photoresist material and a combination of exposure, development, solder plating and etching means.

This method is particularly useful for the preparation of a printed circuit-board with solder plated circuit and through-holes bearing a high density circuit pattern.

9 Claims, 6 Drawing Figures

METHOD FOR PREPARING A PRINTED CIRCUIT BOARD WITH SOLDER PLATED CIRCUIT AND THROUGH-HOLES

FIELD OF THE INVENTION

The present invention relates to a method for preparing a printed circuit board with solder plated circuit and through-holes. More specifically, it concerns a method for preparing a printed circuit board with solder plated circuit and through-holes bearing a high density circuit pattern by using a combination of simple steps, with a high reliability and at a lower expense.

DESCRIPTION OF THE PRIOR ART

Heretofore, various methods have been proposed for the preparation of a printed circuit board with solder plated circuit and through-holes, but none of the methods gave a satisfactory answer to the problems of producing a printed circuit board with a high density circuit pattern in a simple way, and with a high reliability.

For example, in a method wherein a plating resist pattern is formed by a screen printing, it is impossible to form a circuit pattern with a line width of 200μ or less and moreover, there is a drawback of lacking in reliability as a plating resist because of easy occurence of shoulder defects in through holes, and the like.

In another method of using a photosensitive film, there are such problems that the film hardly conforms to an uneven conductive coating surface on a substrate, and the products thus obtained often suffered from lack of reliability as a plating resist, especially in the case with a photocuring type resin film, due to an uneven and undesired curing of the film with entrapped oxygen.

Furthermore, since a light exposure of the photosensitive resin composition is necessarily carried out through a base film, the minimum line width is only limited to the order of 150μ.

The term "solder plated circuit and through-holes" as used herein denotes that all of the circuits including the through-hole portions involved are solder plated.

There is an additional problem of a higher cost because of the necessity of using a base film and a protective film, as well as a photosensitive resin composition.

It has also been well known that a photocuring type, photosensitive resin composition is applied on a conductive material by an electrodeposition means, which is then used for the formation of an image. For example, in Japanese Patent Publication No. 21526/77, there is shown a method wherein a photocuring type composition comprising, as essential ingredients, a polymerizable unsaturated acid and a photopolymerization initiator is applied on a conductive material by an electrodeposition means and is cured by exposing to an actinic radiation. Furthermore, Japanese Patent Application Kokai No. 17827/75 discloses an aqueous alkaline solution developable, image-forming, photocuring type resin composition which is essentially composed of an acrylic resin having an ethylenically unsaturated bonding attached through an ester bonding to a main chain and having free acidic groups, and a photosensitizer. This composition is said to be applicable on an aluminum plate, steel plate, copper plate or stainless steel plate by an electrodeposition means. There also includes such statements that said composition may be uniformly applied by an electrodeposition means onto an article of complicated structure and easily cured by being exposed to an actinic radiation, and that the image wise exposed coating may be developed with an aqueous alkaline solution to obtain a resinous image.

Electrodeposition of such photocuring type resin composition may indeed result in a uniform coating well adhered onto a substrate, but when utilized in the production of a printed circuit board with solder plated circuit and through-holes, the thus obtained coating is practically deficient in the film performance required in the respective process steps involved therein.

Such requirements are workability prior to an exposure with an actinic radiation, developability after exposure, resolution of the formed plating resist, resistant property to a solder plating solution, release characteristics and the like, and they are greatly influenced by the kind of resin used and additives to co-exist therein. Particular attention should be directed to an anionic electrodeposition onto a copper-clad laminate.

In this case, copper ions are dissolved out of the copper coating and reacted with a part of carboxyl groups of the polymer migrated by an electrophoresis to form a copper compound, which is precipitated on the coated product. Since the copper compound is hardly soluble in an aqueous alkaline solution, it causes a decrease in an alkali developability and hence in resolution. Thus, it is unable to obtain a printed circuit board bearing a high density circuit pattern.

An object of the invention is, therefore, to find a method for preparing a printed circuit board with solder plated circuit and through-holes, which is free from the drawbacks possessed by the heretofore know processes. Further object of the invention is to provide a method for preparing a printed circuit board with solder plated circuit and through-holes having a high density circuit pattern thereon, the method being excellent in giving a reliable plating resist and being superior to heretofore known methods in both economical and operational points of view.

SUMMARY OF THE INVENTION

The present invention is directed to a method for preparing a printed circuit board with solder plated circuit and through-holes comprising providing a substrate with a number of through-holes whose surfaces including said through-holes are previously covered with a conductive coating, forming a photosensitive resin layer on said conductive coating by an electrodeposition means with an anionic, photocuring type, photosensitive resin composition containing a chelating agent in an amount of 0.01 to 5 parts by weight per 100 parts by weight of the photosensitive resin, exposing said photosensitive resin layer through a positive mask of circuit pattern placed thereupon, removing the uncured photosensitive resin from the unexposed area with an aqueous or semi-aqueous alkaline solution, thereby forming a plating resist, solder plating the exposed conductive coating, removing the plating resist at the exposed area, and finally subjecting to an etching to remove the conductive coating still remaining at the exposed area.

The invention also provides a method for preparing a printed circuit board with solder plated circuit and through-holes comprising providing a substrate with a number of through-holes, whose surfaces including said through-holes are previously covered with a conductive coating, forming a photosensitive resin layer on said conductive coating by an electrodeposition means with a cationic, photocuring type, photosensitive resin composition, exposing said photosensitive layer through a positive mask of circuit pattern placed therupon, removing the uncured photosensitive resin from the unexposed area with an aqueous acidic solution or solvent, thereby forming a plating resist, solder plating the exposed conductive coating, removing the plating resist at the exposed area, and finally subjecting to an etching to remove the conductive coating still remaining at the exposed area.

BRIEF EXPLANATION OF THE DRAWINGS

The attached drawings depict the photosensitive materials involved in the respective steps of the method of this invention.

DESCRIPTION OF PREFERRED EMBODIMENTS

Figure 1:
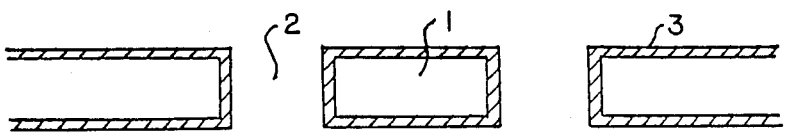
FIG. 1 is a sectional view showing a circuit insulating base plate with through-holes and surface covered with a conductive coating.

In the practice of the present invention, there is provided a substrate with a number of through-holes, whose surfaces including said through-holes are previously covered with a conductive coating. Such board may simply be called a plated board with plated-through-holes.

So far as the plated board is constructed in the above-mentioned structure, any method may be used for the preparation of said plated board. For example, such a plated board may be obtained by providing an insulating board substrate with a number of through-holes, affixing an activation material for an electroless plating use to the whole surface of said substrate including said through-holes, conducting copper electroless plating and then applying a copper by an electrolytic means.

Alternatively, such a plated board may be obtained by perforating a copper clad laminate at the fixed positions, affixing an activation material for an electroless plating use into said holes, and conducting a series of plating, i.e. a copper electroless plating and a copper electrolytic plating, on the whole surface including the through-holes. The photocuring type, photosensitive resin composition used in the present invention may be of either anionic or cationic nature, so far as it can give a continuous film on a conductive coating on the board substrate by an electrodeposition means and can be dissolved by a developer at an unexposed area of said film.

For example, such an electrodeposition bath of an anionic photosensitive resin composition may be composed of carboxyl bearing polymer binder in the form of salt neutralized with a base material, ethylenically unsaturated compound(s), sensitizer, chelating agent, plasticizer and aqueous medium. Examples of the carboxyl bearing polymer binder are copolymer of $\alpha,\beta$-ethylenically unsaturated carboxylic acid and ethylene, copolymer of $\alpha,\beta$-ethylenically unsaturated carboxylic acid and acrylic or methacrylic acid ester, copolymer of $\alpha,\beta$-ethylenically unsaturated carboxylic acid and acrylonitrile, copolymer of $\alpha,\beta$-ethylenically unsaturated carboxylic acid and styrene, carboxyl bearing cellulose derivatives, carboxyl bearing chlorinated polyethylene and the like. Furthermore, a part of carboxyl groups of such organic polymer binder may be reacted with an epoxy bearing unsaturated monomer as, for example, glycidyl methacrylate, thereby introducing in the molecule an unsaturated bond by an esterification, and such modified products may be used as the organic polymer binder.

As the ethylenically unsaturated compound, preference is given to those having 2 and more unsaturated bonds so as to give a crosslinked polymer by a photopolymerization. Examples of the ethylenically unsaturated compound having 2 and more unsaturated bonds are such acrylic or methacrylic acid esters as polyethylene glycol diacrylate, polyethylene glycol dimethacrylate, trimethylolpropane diacrylate, trimethylolpropane dimethacrylate, trimethylolpropane triacrylate, trimethylolpropane trimethyacrylate, pentaerythritol triacrylate and the like.

As the sensitizer, any of the known members including benzoin ethers, xanthones, and acetophenone derivatives may be satisfactorily used.

As the chelating agent, which reacts with copper ions liberated at the time of anionic electrodeposition, thereby giving an improved alkaline solution development, use can be made of a compound capable of forming a complex salt with metal. Examples of the chelating agent are aminopolycarboxylic acid compounds like N-dihydroxyethyl glycine, imino diacetic acid, nitrilotriacetic acid, N-hydroxy ethylimino diacetic acid, ethylenediamine tetra-acetic acid, N,N'-ethylenediamine diacetic acid, N-hydroxyethyl ethylenediamine triacetic acid, diethylenetriamine penta-acetic acid, 1,2-cyclohexanediamine tetra-acetic acid, $\beta$-aminoethyl phosphoric N,N-diacetic acid, ethylenediamine tetra-acetic acid and its salts and the like. Among them, particular preference is given to ethylenediamine tetra-acetic acid and its salts. Besides the above, gluconic acid, citric acid, and their sodium or amine salts may be satisfactorily used.

Plasticizer may be added to the photosensitive resin composition for the purpose of improving film-forming property of the resin and flexibility of the film thus obtained. The amount of plasticizer is 0.1 to 20 parts by weight per 100 parts by weight of the resin. Appropriate plasticizers are phthalate esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate and the like; glycol esters such as dimethyl glycol phthalate, ethyl phthalyl ethyl glycolate, methyl phthalyl ethyl glycolate, butyl phthalyl butyl glycolate, triethylene glycol dicaprylate ester and the like; phosphate esters such as tricresyl phosphate, triphenyl phosphate and the like; aliphatic dibasic acid esters such as diisobutyl adipate, dioctyl adipate, dimethyl sebacate, dibutyl sebacate, dioctyl azelate, dibutyl maleate and the like; triethyl citrate, glycerol triacetyl ester, butyl laurate; and polyalkylene glycol phenyl ethers such as polyethylene glycol phenyl ether, polypropylene glycol phenyl ether and the like. Among them, particular preference is given to polyalkylene glycol phenyl ethers. Examples of the base as used for the neutralization of carboxyl groups of the organic polymer binder are ammonia, alkanol amines and amines such as triethylamine and the like.

The present electrodeposition bath of cationic, photosensitive resin composition may be composed of cationic group bearing (e.g. amino, onium and the like) organic polymer binder, ethylenically unsaturated compound(s), sensitizer and plasticizer and prepared by neutralizing the cationic groups, e.g. amino groups, of said organic binder with an acid and dispersing the composition into water. As the amino bearing organic polymer binder, use can be made of, for example, copolymer of amino bearing acrylate or methacrylate and at least one of the polymerizable monomers selected from acrylate ester, methacrylate ester, styrene, butadiene, acrylonitrile and the like.

Alternatively, a hydroxy bearing polymer is reacted with an isocyanate bearing unsaturated monomer and thus obtained product may be used as the organic polymer binder. As the ethylenically unsaturated compound, sensitizer and plasticizer, reference should be made to the statements hereinbefore given in regard to the anionic photosensitive resin composition.

Examples of acid to be used for the neutralization of amino groups of said cationic organic polymer binder are acetic acid, crotonic acid, itaconic acid and the like.

From the standpoint of adhesion to substrate, flexibility of resinous coating, developing property of photosensitive resin composition (especially of anionic nature), and other objects of this invention, particularly preferred anionic or cationic, photocuring type, photosensitive resin compositions are based on the copolymer obtained by the polymerization of (a) an unsaturated compound of the formula:

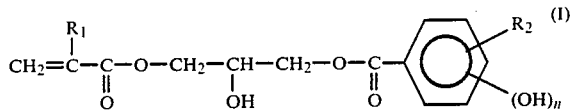

wherein n is an integer of 1 to 3; $R_1$ is hydrogen or methyl group; and $R_2$ is hydrogen, an alkyl having 1 to 5 carbon atoms, an alkoxy or nitro group, and (b) other copolymerizable unsaturated compound(s).

The unsaturated compound of the formula (I) may be easily obtained by the reaction of glycidyl acrylate or glycidyl methacrylate with a hydroxy carboxylic acid of the formula:

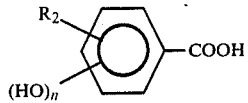

wherein $R_2$ and n are as defined above.

The present anionic or cationic electrodeposition baths may include other additives such as wax, filler, coloring matter and the like, customarily used in an electrodeposition bath, as desired.

In order to apply said anionic or cationic, photocuring type, photosensitive resin composition on plated board, a common electrophoresis means can be utilized in the present invention.

For example, the abovesaid plated board with through-holes is dipped in an electrodeposition bath of the anionic, photosensitive resin composition, an anode is connected to the plated board and a cathode is connected to the metallic bath wall, a direct current is flowed between the electrodes, thereby depositing the anionic, photocuring type photosensitive resin composition on the plated board, and thus treated board is then subjected to drying to form a continuous film of the photosensitive resin composition thereon. In the case of using a cationic, photocuring type, photosensitive resin composition bath, the anode and the cathode are connected just inversely and the similar processes are carried out to obtain a continuous film of the photosensitive resin composition.

Thus obtained film is then exposed through a positive mask of circuit pattern to an actinic radiation, for example, ultra-violet rays. At this time, in either case of anionic or cationic photosensitive layer, crosslinking reaction is only conducted at the exposed area and therefore, when subjected to a subsequent development with an appropriate developer, e.g. an aqueous alkaline solution, the unreacted composition at the unexposed area is dissolved and removed off to expose the underlying conductive coating, thereby providing a plating resist.

Next, a common solder plating is carried out with thus obtained plating resist and the exposed conductive coating is solder plated. The cured resin is then removed off by the treatment with an appropriate solvent or the like and finally the conductive coating remaining at the exposed area is removed off in an alkaline etching bath.

In the present invention, development property of the electrodeposited layer of anionic, photocuring type, photosensitive resin composition is improved by the inclusion of chelating agent in said composition. Employment of novel unsaturated compound (I) has been found to be effective for the additional improvement in said development property, as well as the improvement in the resistant property to a solder plating solution.

In the case with a cationic, photocuring type, photosensitive resin composition, employment of the novel unsaturated compound (I) has been found to be effective for the attainment of improved flexibility of the coating and resistant property to a solder plating solution, too. Plasticizer was used for the improvement in film-forming property and workability of the formed coating, as, for example, positioning and the like.

According to the present method, it is possible to obtain a circuit board bearing a high density circuit pattern in the order of 100μ or less line width.

This method is far superior to the heretofore proposed screen printing method and photosensitive film method in respect of simplicity of processing, reliability of product and economical point of view.

The invention shall be now more fully described in the following examples by referring to attach drawings. Unless otherwise stated, all parts and % are by weight.

EXAMPLE 1

FIG. 1 shows a circuit base plate which consists of an insulating base plate 1 with through-holes 2, whose whole surface including the through-holes is covered by a conductive coating 3.

Figure 2:
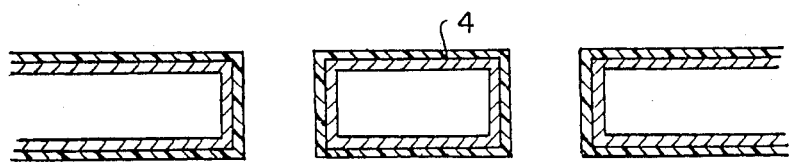
FIG. 2 is a sectional view showing a photosensitive resin composition coated upon the conductive coating.
Figure 3:
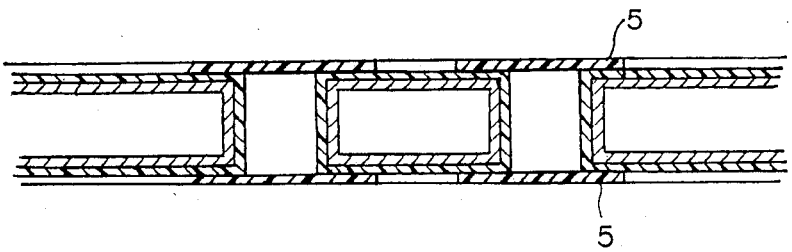
FIG. 3 is a sectional view showing selectively exposing the photosensitive resin composition with a circuit pattern.
Figure 4:
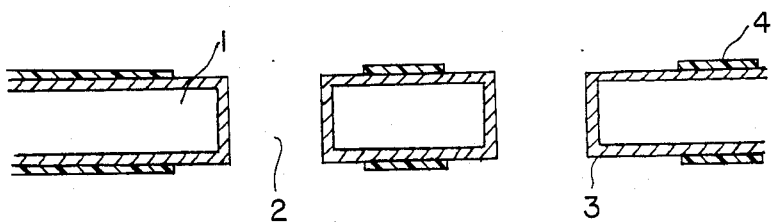
FIG. 4 is a sectional view showing developing the photosensitive resin composition.
Figure 5:
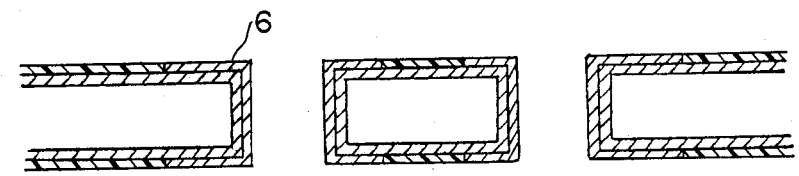
FIG. 5 is a sectional view showing solder plating the exposed conductive coating.
Figure 6:
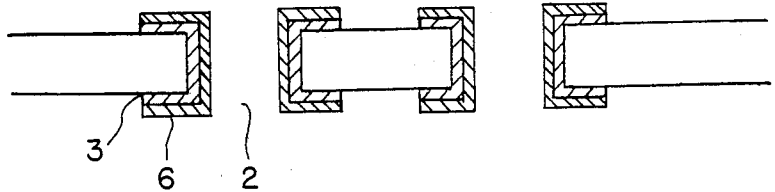
FIG. 6 is a sectional view showing removing the conductive coating at the non-plated area.

An anionic photocuring type, photosensitive resin composition was prepared by mixing 80 parts of resinous binder of copolymer of methacrylic acid:styrene:ethylacrylate=3:2:5 (molar ratio), weight average molecular weight 50,000, 5 parts of microcrystalline wax, 0.5 part of 2,2-dimethoxy 2-phenyl acetophenone, 14.5 parts of trimethylol propane triacrylate, 0.5 part of ethylenediamine tetra-acetic acid and 3 parts of phenoxy ethanol. The resin composition thus obtained was diluted with ethylene glycol monobutyl ether to a non-volatile content of 80%, neutralized with 0.6 equivalent of monoethanolamine and then diluted with pure water to a non-volatile content of 10% to obtain an electrodeposition bath. Next, the circuit base plate of FIG. 1 was dipped into the electrodeposition bath, the base plate was connected to an anode and the metallic wall of the bath to a cathode. Thereafter, 300 V direct current was impressed for 1 minute, thereby effecting the deposition of anionic, photocuring type photosensitive resin composition on the conductive coating 3 on the circuit base plate in about 15µ thickness. Thus obtained plate was then washed with water and dried in an oven maintained at 100° C. for 5 minutes to form a coating 4 of the photocuring type photosensitive resin composition (see FIG. 2). On said photosensitive resin composition coating 4, was placed a positive type photomask 5 with a circuit pattern, and the circuit base plate was illuminated from both sides by a high pressure mercury lamp (see FIG. 3). Thereafter, the resin composition at the unexposed area was dissolved and removed in an aqueous solution of sodium carbonate adjusted to pH 11 and thus the circuit base plate was developed (see FIG. 4). Using an electrolytic solder plating bath, the exposed conductive coating 3 was solder plated (see FIG. 5), and after removing the photosensitive resin composition coating which remained at the exposed area with trichloroethane, the circuit base plate was dipped in an alkaline etching bath, thereby removing the conductive coating at the unplated area and obtaining the circuit board bearing solder plated circuit pattern of line width 80µ and having solder-plated-through-holes (see FIG. 6).

The same procedures were repeated with a photocuring type photosensitive resin composition having the same composition but omitting phenoxy ethanol, and a circuit board bearing a solder plated circuit pattern of line width 100µ and having solder-plated-through-holes was obtained.

EXAMPLE 2

An anionic photocuring type photosensitive resin composition of 100 parts of resinous binder of copolymer of methacrylic acid:styrene:unsaturated compound (obtained by equimolar reaction of gallic acid and glycidyl acrylate):butyl acrylate=4:1:2:3 (molar ratio), weight average molecular weight 80,000, esterified with 25 parts of glycidyl methacrylate, 5 parts of microcrystalline wax, 1 part of 2-hydroxy-2-methyl propiophenone, 10 parts of polyethylene glycol diacrylate, 3 parts of sodium ethylenediamine tetra-acetate and 10 parts of phenoxyethanol was diluted to a non-volatile content of 80% with ethylene glycol monobutyl ether, neutralized with 0.5 equivalent of ammonia and then adjusted to a non-volatile content of 10% with pure water to obtain an electrodeposition bath. Next, the circuit base plate of FIG. 1 was dipped into the electrodeposition bath, the base plate was connected to an anode and the metallic wall of the bath to a cathode. Thereafter, 200 V direct current was impressed for 2 minutes, thereby effecting the deposition of anionic, photocuring type photosensitive resin composition on the conductive coating 3 on the circuit base plate in about 20µ thickness. Thus obtained plate was then washed with water and dried in an oven maintained at 100° C. for 5 minutes to form a coating 4 of the photocuring type photosensitive resin composition (see FIG. 2). On said photosensitive resin composition coating 4, was placed a positive type photomask 5 with a circuit pattern, and the circuit base plate was illuminated from both sides by a high pressure mercury lamp (see FIG. 3). Thereafter, the resin composition at the unexposed area was dissolved and removed in an aqueous solution of sodium carbonate adjusted to pH 11 and thus the circuit base plate was developed (see FIG. 4). Using an electrolytic solder plating bath, the exposed conductive coating 3 was solder plated 6 (see FIG. 5), and after removing the photosensitive resin composition coating which remained at the exposed area with trichloroethane, the circuit base plate was dipped in an alkaline etching bath, thereby removing the conductive coating at the unplated area and obtaining the circuit board bearing solder plated circuit pattern of line width 60µ and having solder-plated-through-holes (see FIG. 6).

EXAMPLE 3

An anionic, photocuring type photosensitive resin composition containing 100 parts of resinous binder of copolymer of acrylic acid:styrene:ethyl acrylate:unsaturated compound obtained by the equimolar reaction of o-hydroxy benzoic acid and glycidyl methacrylate=3:2:3:2 (molar ratio), weight average molecular weight=60,000, 1.5 part of 2-hydroxy-2-methyl propiophenone, 20 parts of trimethylol propane trimethacrylate and 1 part of ethylenediamine tetra-acetic acid, was diluted to a non-volatile content 70% with ethylene glycol monobutyl ether, neutralized with 0.6 equivalent of triethyl amine and adjusted to a non-volatile content of 10% with pure water. Next, the circuit base plate of FIG. 1 was dipped into thus obtained electrodeposition bath, the base plate was connected to an anode and the metallic wall of the bath to a cathode. Thereafter, 250 V direct current was impressed for 1 minute, thereby effecting the deposition of anionic, photocuring type photosensitive resin composition on the conductive coating 3 on the circuit base plate in about 25µ thickness. Thus obtained plate was then washed with water and dried in an oven maintained at 100° C. for 5 minutes to form a coating 4 of the photocuring type photosensitive resin composition (see FIG. 2). On said photosensitive resin composition coating 4, was placed a positive type photomask 5 with a circuit pattern, and the circuit base plate was illuminated from both sides by a high pressure mercury lamp (see FIG. 3). Thereafter, the resin composition at the unexposed area was dissolved and removed in an aqueous solution of sodium carbonate adjusted to pH 11 and thus the circuit base plate was developed (see FIG. 4). Using an electrolytic solder plating bath, the exposed conductive coating 3 was solder plated (see FIG. 5), and after removing the photosensitive resin composition coating which remained at the exposed area with trichloroethane, the circuit base plate was dipped in an alkaline etching bath, thereby removing the conductive coating at the unplated area and obtaining the circuit board bearing solder plated circuit pattern of line width 70µ and having solder-plated-through-holes (see FIG. 6).

EXAMPLE 4

A cationic photocuring type photosensitive resin composition was prepared by mixing uniformly 80 parts of resinous binder of copolymer of N,N-diethyl ammoethyl methacrylate:styrene:ethyl acrylate:unsaturated compound obtained by the equimolar reaction of o-hydroxy benzoic acid and glycidyl acrylate=3:2:4:1 (molar ratio), weight average molecular weight 70,000, 5 parts of microcrystalline wax, 0.5 parts of 2,2-dimethoxy 2-phenyl acetophenone, 14.5 parts of trimethylol propane triacrylate and 5 parts of phenoxyethanol.

The composition was then diluted with ethylene glycol monobutyl ether to a non-volatile content of 80%, neutralized with 0.5 equivalent of acetic acid and adjusted to a non-volatile content of 10% with pure water, to obtain a cationic electrodeposition bath. Next, the circuit base plate of FIG. 1 was dipped into the electrodeposition bath, the base plate was connected to a cathode and the metallic wall of the bath to an anode. Thereafter, 300 V direct current was impressed for 2 minutes, thereby effecting the deposition of cationic, photocuring type photosensitive resin composition on the conductive coating 3 on the circuit base plate in about 20μ thickness. Thus obtained plate was then washed with water and dried in an oven maintained at 100° C. for 5 minutes to form a coating 4 of the photocuring type photosensitive resin composition (see FIG. 2). On said photosensitive resin composition coating 4, was placed a positive type photomask 5 with a circuit pattern, and the circuit base plate was illuminated from both sides by a high pressure mercury lamp (see FIG. 3). Thereafter, the resin composition at the unexposed area was dissolved and removed off in trichloroethane and thus the circuit base plate was developed (see FIG. 4). Using an electrolytic solder plating bath, the exposed conductive coating 3 was solder plated (see FIG. 5), and after removing the photosensitive resin composition coating which remained at the exposed area with methylene chloride, the circuit base plate was dipped in an alkaline etching bath, thereby removing the conductive coating at the unplated area and obtaining the circuit board bearing solder plated circuit pattern of line width 70μ and having solder-plated-through-holes (see FIG. 6).

EXAMPLE 5

A cationic photocuring type photosensitive resin composition was prepared by mixing uniformly 80 parts of resinous binder of copolymer of N,N-diethyl aminoethyl methacrylate:2-hydroxyethyl methacrylate:ethyl acrylate:unsaturated compound obtained by the equimolar reaction of o-hydroxy benzoic acid and glycidyl methacrylate=3:3:2:2 (molar ratio), weight average molecular weight 50,000, reacted with 20 parts of isocyanate ethyl methacrylate, 5 parts of microcrystalline wax, 1 part of 2-hydroxy-2-methyl propiophenone and 10 parts of trimethylol propane triacrylate. This composition was then diluted to a non-volatile content of 80% with butyl glycol, neutralized with 0.6 equivalent of acetic acid, adjusted to a non-volatile content of 10% with pure water to obtain a cationic electrodeposition bath. Next, the circuit base plate of FIG. 1 was dipped into the electrodeposition bath, the base plate was connected to a cathode and the metallic wall of the bath to an anode. Thereafter, 250 V direct current was impressed for 2 minutes, thereby effecting the deposition of cationic, photocuring type photosensitive resin composition on the conductive coating 3 on the circuit base plate in about 20μ thickness. Thus obtained plate was then washed with water and dried in an oven maintained at 100° C. for 5 minutes to form a coating 4 of the photocuring type photosensitive resin composition (see FIG. 2). On said photosensitive resin composition coating 4, was placed a positive type photomask 5 with a circuit pattern, and the circuit base plate was illuminated from both sides by a high pressure mercury lamp (see FIG. 3). Thereafter, the resin composition at the unexposed area was dissolved and removed off with trichloroethane and thus the circuit base plate was developed (see FIG. 4). Using an electrolytic solder plating bath, the exposed conductive coating 3 was solder plated (see FIG. 5), and after removing the photosensitive resin composition coating which remained at the exposed area with methylene chloride, the circuit base plate was dipped in an alkaline etching bath, thereby removing the conductive coating at the unplated area and obtaining the circuit board bearing solder plated circuit pattern of line width 90μ and having solder-plated-through-holes (see FIG. 6).

What is claimed is:

1. A method for preparing a printed circuit board with solder plated circuit and through-holes comprising providing a substrate with a number of through-holes whose surfaces including said through-holes are previously covered with a conductive coating,
   forming a photosensitive resin layer on said conductive coating by an electrodeposition means with an anionic, photocuring type, photosensitive resin composition containing a chelating agent in an amount of 0.01 to 5 parts by weight per 100 parts by weight of the photosensitive resin,
   exposing said photosensitive resin layer through a positive mask of circuit pattern placed thereupon,
   removing the uncured photosensitive resin from the unexposed area with an aqueous or a semi-aqueous alkaline solution, thereby forming a plating resist, solder plating the exposed conductive coating,
   removing the plating resist at the exposed area, and finally subjecting to an etching to remove the conductive coating still remaining at the exposed area.

2. A method according to claim 1, wherein the chelating agent is an amino-polycarboxylic acid compound.

3. A method according to claim 1, wherein the anionic, photocuring type, photosensitive resin composition is based on a copolymer of
   (a) an unsaturated compound represented by the formula:

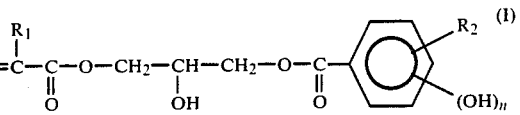

which n is an integer of 1 to 3; $R_1$ is hydrogen or methyl group; and $R_2$ is hydrogen, an alkyl having 1 to 5 carbon atoms, an alkoxy or nitro group, and
   (b) other copolymerizable unsaturated compounds.

4. A method according to claim 1, wherein the anionic photocuring type, photosensitive resin composition contains a plasticizer in an amount of 0.1 to 20 parts by weight per 100 parts by weight of the resin.

5. A method according to claim 4, wherein the plasticizer is a polyalkylene glycol phenyl ether.

6. A method for preparing a printed circuit board with solder plated circuit and through-holes comprising providing a substrate with a number of through-holes, whose surfaces including said through-holes are previously covered with a conductive coating, forming a photosensitive resin layer on said conductive coating by an electrodeposition means with a cationic, photocuring type, photosensitive resin composition, exposing said photosensitive layer through a positive mask of circuit pattern placed thereupon, developing said photosensitive layer with an aqueous acidic solution or solvent, thereby removing the uncured photosensitive resin from the unexposed area and forming a plating resist, solder plating the exposed conductive coating, removing the plating resist at the exposed area, and finally subjecting to an etching to remove the conductive coating still remaining at the exposed area.

7. A method according to claim 6, wherein the cationic, photocuring type, photosensitive resin composition is based on a copolymer of (a) an unsaturated compound represented by the formula:

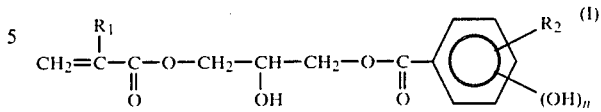

in which n is an integer of 1 to 3; $R_1$ is hydrogen or methyl group; and $R_2$ is hydrogen, an alkyl having 1 to 5 carbon atoms, an alkoxy or nitro group, and (b) other copolymerizable unsaturated compounds.

8. A method according to claim 6, wherein the cationic, photocuring type, photosensitive resin composition contains a plasticizer in an amount of 0.1 to 20 parts by weight per 100 parts by weight of the resin.

9. A method according to claim 8, wherein the plasticizer is a polyalkylene glycol phenyl ether.

* * * * *